(12) United States Patent
Mizutani et al.

(10) Patent No.: US 9,117,972 B2
(45) Date of Patent: Aug. 25, 2015

(54) GROUP III NITRIDE SEMICONDUCTOR LIGHT-EMITTING DEVICE

(71) Applicant: TOYODA GOSEI CO., LTD., Kiyosu-shi (JP)

(72) Inventors: Koichi Mizutani, Kiyosu (JP); Ryohei Inazawa, Kiyosu (JP); Yuhei Ikemoto, Kiyosu (JP); Tomoyuki Tainaka, Kiyosu (KR)

(73) Assignee: TOYODA GOSEI CO., LTD., Kiyosu-shi, Aichi-Ken (JP)

( * ) Notice: Subject to any disclaimer, the term of this patent is extended or adjusted under 35 U.S.C. 154(b) by 0 days.

(21) Appl. No.: 13/706,262

(22) Filed: Dec. 5, 2012

(65) Prior Publication Data
US 2013/0153950 A1   Jun. 20, 2013

(30) Foreign Application Priority Data
Dec. 16, 2011   (JP) .................................. 2011-275518

(51) Int. Cl.
*H01L 33/00*   (2010.01)
*H01L 33/40*   (2010.01)
*H01L 33/38*   (2010.01)

(52) U.S. Cl.
CPC .............. *H01L 33/40* (2013.01); *H01L 33/38* (2013.01); *H01L 33/0079* (2013.01)

(58) Field of Classification Search
CPC ...................................................... H01L 33/18
USPC ........................................................... 257/13
See application file for complete search history.

(56) References Cited

U.S. PATENT DOCUMENTS

| 7,420,218 B2 | 9/2008 | Nagai |
| 7,436,001 B2 | 10/2008 | Lee et al. |
| 8,471,241 B2 | 6/2013 | Choi et al. |
| 8,581,295 B2 | 11/2013 | Kuramoto |

(Continued)

FOREIGN PATENT DOCUMENTS

| JP | 2007-150259 A | 6/2007 |
| JP | 2007-529879 A | 10/2007 |

(Continued)

OTHER PUBLICATIONS

Japanese Office Action dated Jun. 24, 2014 with a partial English translation thereof.
Chinese Office Action dated Feb. 3, 2015 with English Translation.
SIPO Office Action dated Feb. 3, 2015 with an English Translation.

*Primary Examiner* — Yu-Hsi D Sun
*Assistant Examiner* — Ankush Singal
(74) *Attorney, Agent, or Firm* — McGinn IP Law Group, PLLC

(57) ABSTRACT

The light-emitting device has a semiconductor layer including a p-layer, a light-emitting layer, and an n-layer, which are formed of a Group III nitride semiconductor, and an n-electrode on the n-layer. The device also has a device isolation trench which runs along the outer periphery of the semiconductor layer and which provides the semiconductor layer with a mesa shape; and an insulation film continuously provided on first to third regions, the first region being an outer peripheral region of the n-layer, the second region being the side surface of the trench, and the third region being the bottom surface of the device isolation trench. The n-electrode consists of two pad portions and a wire trace portion. The outer peripheral wire trace portion is formed as a frame completely contouring the periphery of the device.

20 Claims, 11 Drawing Sheets

(56) References Cited

U.S. PATENT DOCUMENTS

| | | |
|---|---|---|
| 2007/0018187 A1 | 1/2007 | Lee et al. |
| 2007/0096123 A1 | 5/2007 | Utsumi et al. |
| 2007/0181895 A1 | 8/2007 | Nagai |
| 2008/0017878 A1 | 1/2008 | Kuramoto |
| 2010/0163894 A1* | 7/2010 | Uemura et al. ............ 257/95 |
| 2010/0216270 A1* | 8/2010 | Liu et al. ............ 438/47 |
| 2011/0204402 A1* | 8/2011 | Jeong et al. ............ 257/98 |
| 2011/0248237 A1 | 10/2011 | Choi et al. |
| 2013/0032845 A1* | 2/2013 | Chuang et al. ............ 257/99 |

FOREIGN PATENT DOCUMENTS

| | | |
|---|---|---|
| JP | 2008-047871 A | 2/2008 |
| JP | 2010-157579 A | 7/2010 |
| JP | 2010-212719 A | 9/2010 |
| JP | 2011-114240 A | 6/2011 |
| JP | 2011-223000 A | 11/2011 |

* cited by examiner

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device which has been removed from a growth substrate through the substrate lift-off technique and which has been joined to a support. Particularly, the semiconductor light-emitting device has a characteristic n-electrode configuration.

2. Background Art

Generally, a sapphire substrate is employed as a substrate for growing a Group III nitride semiconductor. The sapphire substrate has poor electrical conductivity and thermal conductivity and has no clear cleavage planes, making processing of the substrate difficult. In order to solve these problems, there has been developed the substrate lift-off technique, in which a Group III nitride semiconductor is grown on a growth substrate, and the substrate is then removed.

One specific technique thereof is a laser lift-off technique. In laser lift-off, a Group III nitride semiconductor layer is joined to a support substrate, and the interface between a growth substrate and the Group III nitride semiconductor is irradiated with a laser beam, to thereby decompose the Group III nitride semiconductor layer, whereby the growth substrate is removed. Another known specific technique is a chemical lift-off technique, in which a Group III nitride semiconductor layer is provided, in the vicinity of the growth substrate, with a layer which can be readily dissolved by a chemical liquid; the Group III nitride semiconductor layer is joined to a support substrate; and the layer which can be readily dissolved by a chemical agent is dissolved by a chemical liquid of interest, to thereby remove the growth substrate.

In the Group III nitride semiconductor light-emitting device produced through the lift-off technique, an n-electrode is disposed on the n-layer exposed through removal of the substrate, and a support substrate made of a conductive material is employed, to thereby establish electrical conduction in the depth direction. For realizing diffusion of current over the surface of the Group III nitride semiconductor light-emitting device having such a structure, the n-electrode is known to have a structure including a pad portion and a wiring trace portion (see, for example, Patent Documents 1 and 2). The pad portion is connected with a boding wire, and the wire trace portion extends from the pad portion.

Meanwhile, in the case of the Group III nitride semiconductor light-emitting device produced through substrate lift-off, light is extracted from the n-layer side. In this case, the n-electrode reflects and absorbs the light, thereby problematically impairing light extraction efficiency. When the area of the n-electrode is reduced so as to prevent light reflection and absorption, the driving voltage of the device unavoidably increases. In order to cope with these problems, Patent Documents 1 and 2 disclose the following modifications of the n-electrode including a pad portion and a wire trace portion.

Patent Document 1 discloses a structure having an outer peripheral wire trace portion contouring the outer periphery of the device, the wire trace portion forming a frame-like structure, whereby current can be supplied to the entire light-emitting area. In addition, through forming a part of the pad portion of the n-electrode on the insulation film, concentration of current to the pad portion is prevented, and current diffusion over the light-emitting area can be attained. Furthermore, since the contact area between the pad portion and the n-layer decreases, light emission directly under the pad portion is suppressed, and reflection and absorption of light can be prevented.

Patent Document 2 discloses an n-electrode having a structure including: two pad portions; first and second extending portions which have a wire shape, which extend from the two pad portions, and which are separated in parallel from each other; a third extending portion which is disposed between the first and second extending portions and which is parallel to the first and second extending portions; and a first connection extending portion which connects the first and the third extending portions and a second connection extending portion which connects the second and the third extending portions, the first and second connection extending portion being separated in parallel from each other. The n-electrode has no frame-shape portion contouring the outer periphery of the device. By virtue of the n-electrode having such a structure, light extraction efficiency is enhanced, and elevation in driving voltage can be suppressed.

Patent Document 1: Japanese Patent Application Laid-Open (kokai) No. 2010-157579
Patent Document 2: Japanese Patent Application Laid-Open (kokai) No. 2011-114240

SUMMARY OF THE INVENTION

However, even when an n-electrode structure as disclosed in Patent Documents 1 and 2 is employed, the effect of preventing light reflection and absorption by the n-electrode is insufficient. That is, the light extraction efficiency cannot be fully enhanced.

Thus, an object of the present invention is to provide a Group III nitride semiconductor light-emitting device in which light reflection and absorption by an n-electrode are reduced, to thereby enhance light extraction efficiency.

In a first aspect of the present invention, there is provided a Group III nitride semiconductor light-emitting device, having a conductive support, a p-electrode disposed on the support, a semiconductor layer disposed on the p-electrode, the semiconductor layer being composed of at least a p-layer, a light-emitting layer, and an n-layer disposed in this order from the p-electrode, each of the three layers formed of a Group III nitride semiconductor, and an n-electrode disposed on the n-layer, wherein the device has a device isolation trench which is formed along the outer periphery of the semiconductor layer and which provides the semiconductor layer with a mesa shape; and an insulation film continuously provided on first to third regions, the first region being an outer peripheral region of the n-layer, the second region being the side surface of the trench, and the third region being the bottom surface of the device isolation trench; and the n-electrode has a pad portion to which a bonding wire is to be connected;

a contact portion which is disposed at a distance from the pad portion and which is partially or fully disposed on the n-layer; and an outer peripheral wire trace portion which extends so as to contour the periphery, to thereby connect the pad portion with the contact portion and which is totally disposed on the insulation film, or which is partially disposed on the insulation film, the remaining part thereof being disposed on the n-layer.

As used herein, the term "outer periphery" refers to the contour of the Group III nitride semiconductor light-emitting device or a region in the vicinity thereof, in the planar view.

The pad portion or the contact portion may be provided singly, or a plurality of pad portions or contact portions may be provided. The contact portion may also serve as the pad portion. No particular limitation is imposed on the shape of the outer peripheral wire trace portion, so long as it is a line (wire) form. The line may be a straight line, a curve, or a mixture thereof. The n-electrode may include a dividing portion which connects with the outer peripheral wire trace portion and which divides an area surrounded by the outer peripheral wire trace portion. The pad portion and the outer peripheral wire trace portion, or the contact portion and the outer peripheral wire trace portion may be directly connected with each other, or indirectly connected with each other via, for example, the dividing portion.

The pad portion may be fully disposed on the n-layer. Preferably, a part or the entirety of the pad portion is disposed on the insulation film, since impairment in light extraction efficiency, which would otherwise be caused by light reflection and light absorption by the pad portion, can be prevented. Similarly, the contact portion may be fully disposed on the n-layer. Preferably, a part of the contact portion is disposed on the insulation film, since impairment in light extraction efficiency, which would otherwise be caused by light reflection and light absorption by the contact portion, can be prevented.

The pad portion, the contact portion, and the outer peripheral wire trace portion may be formed of the same material or different materials. The pad portion and the contact portion may be formed from a material which is in ohmic contact with the n-layer. The outer peripheral wire trace portion may be formed of a material exhibiting an adhesion to the insulation film higher than an adhesion of the material of the pad portion. Examples of the material which is in ohmic contact with the n-layer comprises at least one selected from a group consisting of Ti, W, Al, Cr, and an alloy thereof. Examples of the material exhibiting higher adhesion to the insulation film comprise Ni and an alloy thereof. No particular limitation is imposed on the shape in planar view of the pad portion and the contact portion, and examples of the shape include square, rectangle, circle, and a fan shape.

On the n-layer, a transparent electrode made of ITO or a similar material may be disposed. The transparent electrode can further enhance current diffusion to the device plane. The surface of the n-layer (plane of the n-electrode-formed side) may have an embossed shape so as to enhance light extraction efficiency.

A second aspect of the invention is directed to a specific embodiment of the Group III nitride semiconductor light-emitting device of the first aspect, wherein the entirety of the outer peripheral wire trace portion is disposed on the insulation film.

A third aspect of the invention is directed to a specific embodiment of the Group III nitride semiconductor light-emitting device of the second aspect, wherein the outer peripheral wire trace portion is disposed on only the third region of the insulation film.

A fourth aspect of the invention is directed to a specific embodiment of the Group III nitride semiconductor light-emitting device of any of the first to third aspects, wherein a part of the pad portion is disposed on the insulation film, and the remaining part of the pad portion is disposed on the n-layer.

A fifth aspect of the invention is directed to a specific embodiment of the Group III nitride semiconductor light-emitting device of the fourth aspect, wherein the entirety of the pad portion is disposed on the insulation film.

A sixth aspect of the invention is directed to a specific embodiment of the Group III nitride semiconductor light-emitting device of the fifth aspect, wherein the entirety of the pad portion is disposed on the third region of the insulation film.

A seventh aspect of the invention is directed to a specific embodiment of the Group III nitride semiconductor light-emitting device of any of the first to sixth aspects, wherein a part of the contact portion is disposed on the insulation film, and the remaining part of the contact portion is disposed on the n-layer.

An eighth aspect of the invention is directed to a specific embodiment of the Group III nitride semiconductor light-emitting device of any of the first to seventh aspects, which has a transparent electrode disposed on the n-layer.

A ninth aspect of the invention is directed to a specific embodiment of the Group III nitride semiconductor light-emitting device of any of the first to eight aspects, wherein the n-layer has an embossed surface on the side opposite the light-emitting layer.

A tenth aspect of the invention is directed to a specific embodiment of the Group III nitride semiconductor light-emitting device of any of the first to ninth aspects, wherein the pad portion, the contact portion and the outer peripheral wire trace portion of the n-electrode are formed of a same material.

An eleventh aspect of the invention is directed to a specific embodiment of the Group III nitride semiconductor light-emitting device of the tenth aspect, wherein the pad portion, the contact portion and the outer peripheral wire trace portion of the n-electrode comprises at least one selected from a group consisting of Ti, W, Al, Cr, and an alloy thereof.

A twelfth aspect of the invention is directed to a specific embodiment of the Group III nitride semiconductor light-emitting device of any of the first to ninth aspects, wherein the pad portion and the contact portion serving as n-electrodes comprise a material which is in ohmic contact with the n-layer, and the outer peripheral wire trace portion serving as the n-electrode comprises a material exhibiting an adhesion to the insulation film higher than an adhesion of the material of the pad portion.

A thirteenth aspect of the invention is directed to a specific embodiment of the Group III nitride semiconductor light-emitting device of the twelfth aspect, wherein the pad portion and the contact portion comprise at least one selected from a group consisting of Ti, W, Al, Cr, and an alloy thereof, and the outer peripheral wire trace portion comprises a material which is different from the material of the pad portion and which comprises at least one selected from a group consisting of Ni, Ti, Cu, Al, and an alloy thereof.

A fourteenth aspect of the invention is directed to a specific embodiment of the Group III nitride semiconductor light-emitting device of any of the first to thirteenth aspects, wherein the contact portion also serves as the pad portion.

According to the present invention, the n-electrode comprises a pad portion, a contact portion, and an outer peripheral wire trace portion which connects the pad portion with the contact portion, and a part or the entirety of the outer peripheral wire trace portion is disposed on an insulation film which has been continuously formed in the bottom surface and the side surface of a device isolation trench and on the outer peripheral region of the n-layer, whereby light reflection and light absorption can be reduced, and light extraction efficiency can be enhanced. Particularly, the present invention is effective for a Group III nitride semiconductor light-emitting device having a structure impeding uniform current flow; e.g., a rectangular shape in planar view having a high aspect ratio. According to the present invention, even when the Group III nitride semiconductor light-emitting device has such a shape, uniform current diffusion over the light-emitting region can be attained, and light emission efficiency can be enhanced without lowering light output.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiment of the present invention will next be described with reference to the attached drawings. However, the embodiments should not be construed as limiting the present invention thereto. Unless otherwise specified, the term "outer periphery" refers to the contour of the device or a region in the vicinity thereof, in the planar view.

Embodiment 1

Figure 1:
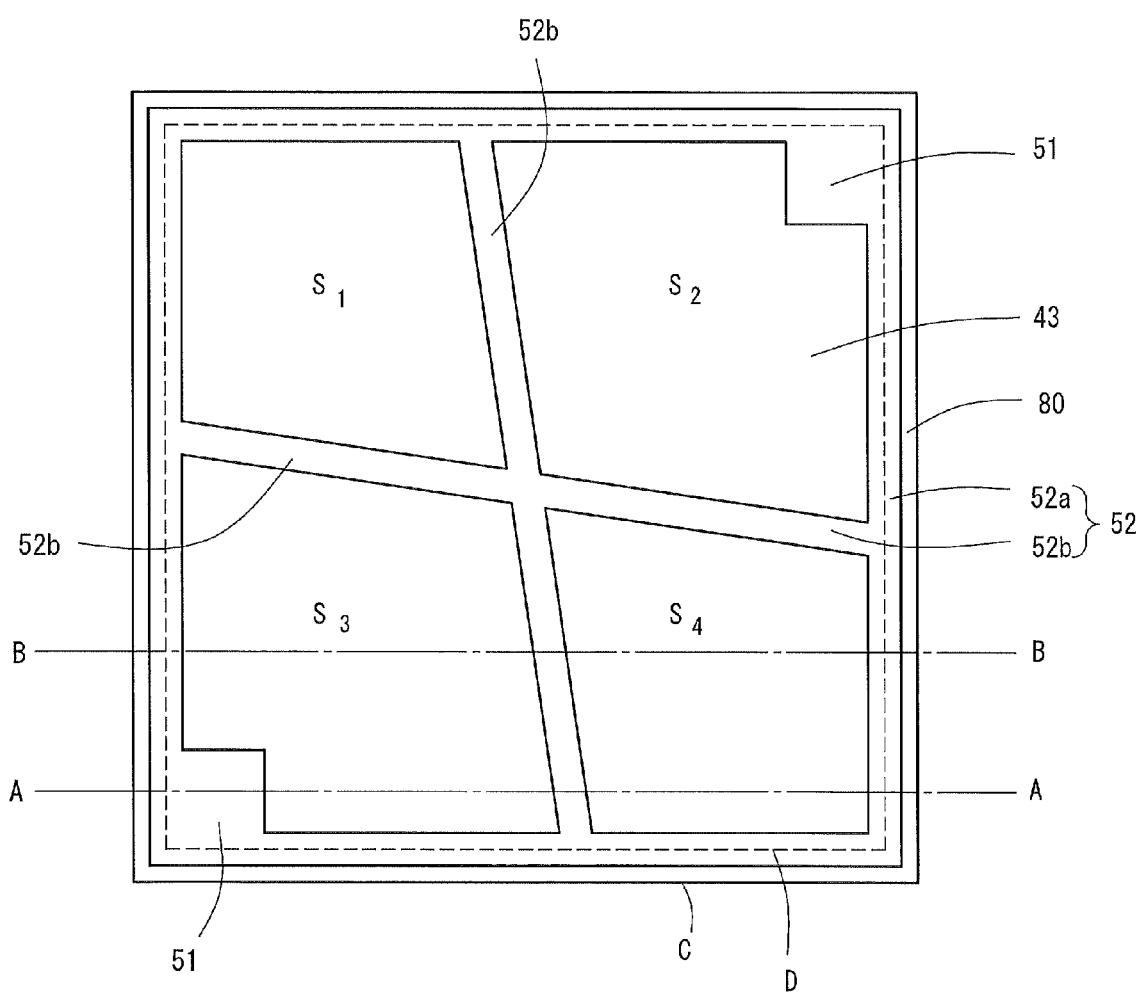
FIG. 1 is a plan view showing the configuration of the Group III nitride semiconductor light-emitting device of Embodiment 1.
Figure 2:
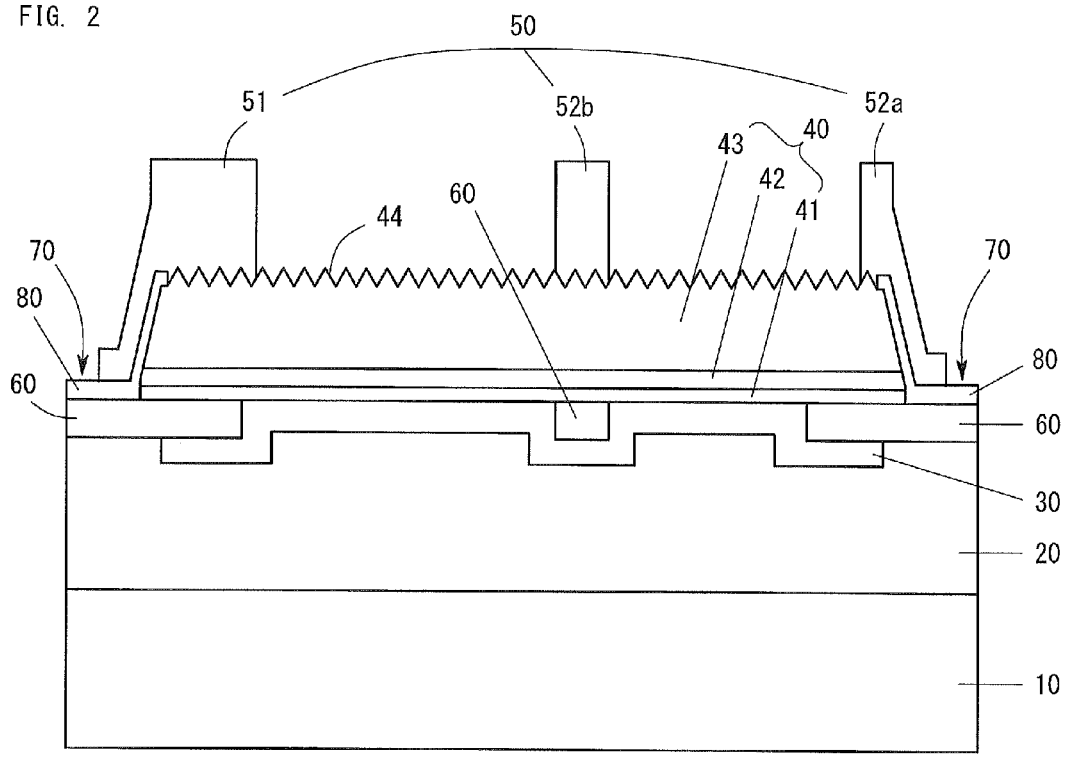
FIG. 2 is a cross-section (cut along A-A) showing the configuration of the Group III nitride semiconductor light-emitting device of Embodiment 1.
Figure 3:
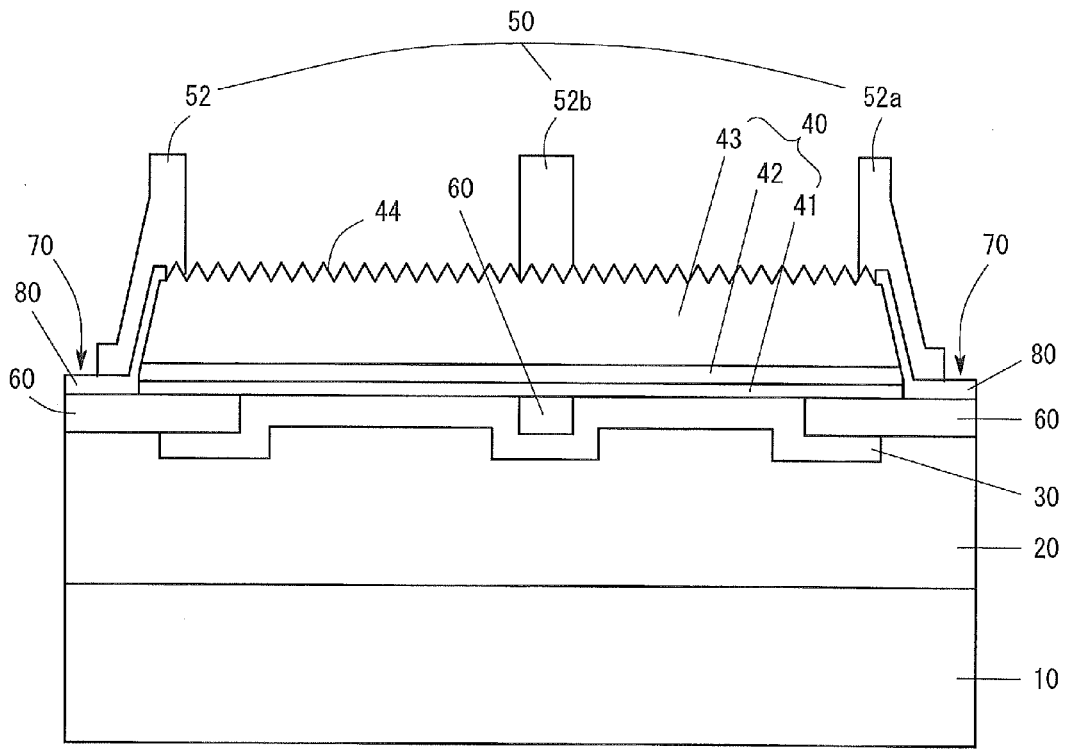
FIG. 3 is a cross-section (cut along B-B) showing the configuration of the Group III nitride semiconductor light-emitting device of Embodiment 1.

FIG. 1 is a plan view showing the configuration of the Group III nitride semiconductor light-emitting device 1 of Embodiment 1. FIG. 2 is a cross-section of the light-emitting device shown in FIG. 1 cut along line segment A-A, and FIG. 3 is a cross-section of the light-emitting device shown in FIG. 1 cut along line segment B-B. As shown in FIG. 1, the Group III nitride semiconductor light-emitting device of Embodiment 1 has a square shape in planar view.

As shown in FIGS. 2 and 3, the Group III nitride semiconductor light-emitting device 1 of Embodiment 1 has a conductive support 10, a p-electrode 30 joined onto the support 10 via a joining layer 20, a semiconductor layer 40 formed of a Group III nitride semiconductor and disposed on the p-electrode 30, and an n-electrode 50 disposed on the semiconductor layer 40. The semiconductor layer 40 has a stacked structure including a p-layer 41, a light-emitting layer 42, and an n-layer 43, disposed in this order from the p-electrode 30. A current injection blocking layer 60 is provided between the p-electrode 30 and the semiconductor layer 40 at a position facing the n-electrode 50 in planar view. At the end portion of the semiconductor layer 40 (corresponding to the outer peripheral region of the device in planar view), a device isolation trench 70 is formed. The device isolation trench 70 runs along the semiconductor layer 40. An insulation film 80 is continuously formed on the area including the bottom surface of the device isolation trench 70, the side surface thereof, and the end portion of the n-layer 43. In use of the Group III nitride semiconductor light-emitting device of Embodiment 1, a voltage is applied between the n-electrode 50 and a backside electrode (not illustrated) disposed on the backside of the support 10 (the surface opposite the joining layer 20) so as to establish electrical conduction in a direction orthogonal to the device main surface, and the emitted light is extracted from the n-layer 43 side.

The support 10 may be a conductive substrate formed of a material such as Si, GaAs, Cu, Ge, or Cu—W. The joining layer 20 may be a eutectic metal layer such as an Au—Sn layer, an Au—Si layer, an Ag—Sn—Cu layer, or an Sn—Bi layer, or may be an Au layer, an Sn layer, a Cu layer, etc., which are not low-melting metal layers. Instead of joining the support 10 to the p-electrode 30 by the mediation of the joining layer, a metal (e.g., Cu) layer may be directly formed on the p-electrode 30 through plating, sputtering, or a similar technique, to thereby serve as the support 10. The p-electrode 30 may be formed of a high-reflectance and low-contact-resistance metal such as Ag, Rh, Pt, Ru, or an alloy containing any of these as a base, or may be formed of Ni, an Ni alloy, an Au alloy, etc. Alternatively, the p-electrode 30 may be a composite layer composed of a transparent electrode film (e.g., ITO, ICO (cerium-doped indium oxide), or IZO (zinc-doped indium oxide)) and a high-reflectance metal film. That is, the surface of the p-electrode in contact with the semiconductor layer 40 may be a transparent electrode film. The transparent electrode film may be formed of a transparent conductive oxide such as ITO or a thin film of a metal such as Au.

The current injection blocking layer 60 is disposed between the p-electrode 30 and the semiconductor layer 40 in a region corresponding to the n-electrode 50 in planar view, and also in a region corresponding to the end region of the semiconductor layer 40. The current injection blocking layer 60 prevents injection of current, via contact with the p-electrode 30, to the non-light-emitting end region of the semiconductor layer 40 and to a region where emitted light is virtually reflected or absorbed by the n-electrode 50, whereby light emission efficiency is enhanced. The current injection blocking layer 60 may be formed of a material such as $SiO_2$, $TiO_2$, $ZrO_2$, $Al_2O_3$, $Si_xN_y$, or $SiO_xN_y$. The current injection blocking layer 60 may be a single layer of any of these materials, or may be formed of a plurality of layers thereof. The current injection blocking layer 60 may be employed as a reflection mirror formed of a dielectric multilayer film, so as to reflect light toward the n-layer 43, to thereby enhance light extraction efficiency.

The p-layer 41, the light-emitting layer 42, and the p-layer 43, forming the semiconductor layer 40 may have any structure known to be employed in Group III nitride semiconductor light-emitting devices. For example, the p-layer 41 may have a structure including an Mg-doped GaN p-contact layer deposited on the support 10, and an Mg-doped AlGaN p-cladding layer deposited on the p-contact layer. The light-emitting layer 42 may have an MQW structure in which a GaN barrier layer and an InGaN well layer are repeatedly deposited. The n-layer 43 may have structure including a GaN n-cladding layer deposited on the light-emitting layer 42, and a highly Si-doped GaN n-contact layer deposited thereon. The support 10 and the semiconductor layer 40 disposed on the support have a square shape in planar view.

The surface of the n-layer 43 (surface opposite the light-emitting layer 42 side) may be provided with embossment 44 through wet etching by use of an aqueous solution of KOH, NaOH, TMAH (tetramethylammonium hydroxide), phosphoric acid, etc. The embossment 44 consists of a large number of micro-scale pyramids, and side surfaces of the pyramids incline with respect to the device main surface at about 60°. By virtue of the presence of the embossment 44, light extraction efficiency is enhanced. In a preferred mode, the embossment 44 is not provided in a region where the n-electrode 50 is to be formed, within the surface of the n-layer 43. That is, the region preferably remains flat. The reason for this is to prevent multiple reflection of light between the backside of the n-electrode 50 (n-layer 43 side) and the embossment 44, resulting in impairment in light extraction efficiency.

Figure 4:
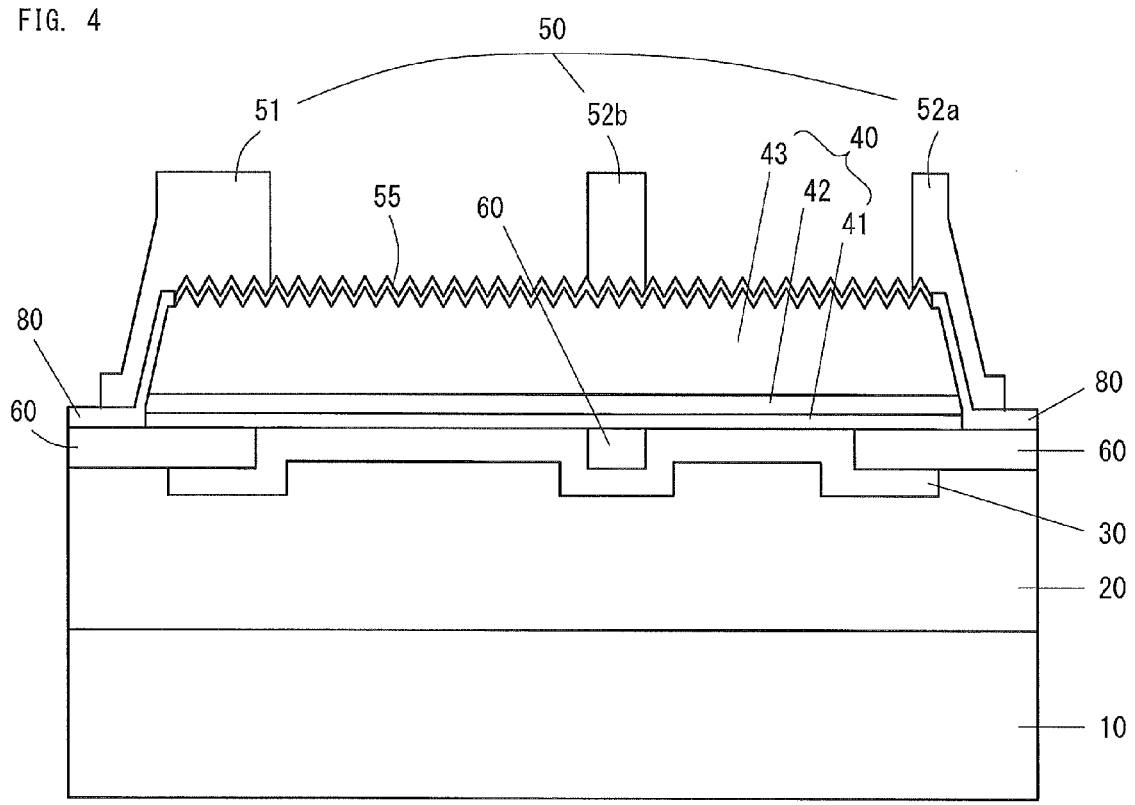
FIG. 4 is a cross-section showing the configuration of a variation of the Group III nitride semiconductor light-emitting device of Embodiment 1.

On the surface of the n-layer 43, a transparent electrode formed of a transparent conductive oxide (e.g., ITO, ICO, or IZO) or a metal (e.g., Au) thin film may be disposed. The transparent electrode realizes effective current diffusion in the device direction. In one variation of the Group III nitride semiconductor light-emitting device of Example 1, a transparent electrode 55 is formed on the surface of the n-layer 43. The cross-section of the Group III nitride semiconductor light-emitting device is shown in FIG. 4. Similar to FIG. 2, FIG. 4 is a cross-section cut along A-A, which is shown in FIG. 1. As shown in FIG. 4, the transparent electrode 55 is formed as a film on the embossment 44 of the surface of the n-layer 43, and the n-electrode 50 is formed on the transparent electrode 55.

The device isolation trench 70 is a trench for isolating the devices derived from the semiconductor layer 40 formed on the growth substrate, and is provided in production of the Group III nitride semiconductor light-emitting device of Embodiment 1. After completion of production of the light-emitting device, as shown in FIGS. 1 to 3, the isolation trench is formed at the outer periphery of the device so that semiconductor layer 40 is provided with a mesa. The device isolation trench 70 runs along the semiconductor layer 40.

The insulation film 80 is formed so as to continuously cover the bottom surface and the side surface of the device isolation trench 70, and the periphery of the surface of the n-layer 43. As shown in FIG. 1, in planar view, the domain of the insulation film 80 is defined by the contour of the device C and the dotted line D and assumes the square frame region. The insulation film 80 prevents current leakage or short circuit, which would otherwise be caused by exposure of the p-layer 41, the light-emitting layer 42, and the n-layer 43 to the side surface of the device isolation trench 70. Hereinafter, a region of the insulation film 80 disposed on the periphery of the surface of the n-layer 43 is called a first region 80a, a region of the insulation film 80 disposed on the side surface of the device isolation trench 70 is called a second region 80b, and a region of the insulation film 80 disposed on the bottom surface of the device isolation trench 70 is called a third region 80c. The insulation film 80 may be formed of a material such as $SiO_2$, $TiO_2$, $ZrO_2$, $Al_2O_3$, $Si_xN_y$, AlN, or $SiO_xN_y$.

The insulation film 80 may be a single layer of any of these materials, or may be formed of a plurality of layers thereof. The insulation film 80 may be employed as a reflection mirror or an AR film formed of a dielectric multilayer film. The insulation film 80 may be formed of the same material as that of the current injection blocking layer 60.

As shown in FIG. 1, the n-electrode 50 consists of two pad portions 51 and a wire trace portion 52. The wire trace portion 52 consists of an outer peripheral wire trace portion 52a and a dividing portion 52b. The pad portion 51 and the wire trace portion 52 are made of the same material, which can be in ohmic contact with the n-layer 43. Examples of the material include Ti, W, Al, Cr, and an alloy thereof.

As shown in FIG. 1, two pad portions 51 are separately disposed at opposite corners of the device square in planar view. Each pad portion 51 has a rectangular shape in planar view. However, no particular limitation is imposed on the shape, so long as a pad area sufficient for wire bonding is ensured, and a circle or a fan shape (¼ of a circle) may be employed. The outer peripheral wire trace portion 52a is formed so as to assume a frame completely contouring the periphery of the device. The two pad portions 51 are connected with each other by the mediation of the outer peripheral wire trace portion 52a. The dividing portion 52b basically assumes a cross-shape line pattern in which each of two lines is almost parallel to but slight inclined with respect to one side of the device square in planar view. The intersection of the cross-shape line pattern corresponds to the center of the device in planar view. Each of the two lines forming the cross shape is connected at each end to the outer peripheral wire trace portion 52a. Among regions S1 to S4, which are defined by the outer peripheral wire trace portion 52a and the dividing portion 52b, the regions S2, S3 including the pad portion 51 are wider than the regions S1, S4 including no pad portion. Since a region in the vicinity of the pad portion 51 facilitates current diffusion, current diffusion can be enhanced in the case where the regions S2, S3 including the pad portion 51 are provided to be wider than the regions S1, S4 including no pad portion 51.

As shown in FIG. 2, a part of the pad portion 51 is disposed on the n-layer 43, and the other part is disposed on the insulation film 80. The part of the pad portion disposed on the insulation film 80 continuously covers the first region 80a, the second region 80b, and the third region 80c of the insulation film 80.

As shown in FIG. 2, a part of the outer peripheral wire trace portion 52a is disposed on the n-layer 43, and the other part is disposed on the insulation film 80. The part of the outer peripheral wire trace portion disposed on the insulation film 80 continuously covers the first region 80a, the second region 80b, and the third region 80c of the insulation film 80.

In the aforementioned n-electrode 50 of the Group III nitride semiconductor light-emitting device of Embodiment 1, electrons are injected into the two pad portions 51 connected with bonding wire, and the electrons are caused to diffuse the periphery of the device by the mediation of the outer peripheral wire trace portion 52a. The electrons further diffuse the dividing portion 52b, connected with the outer peripheral wire trace portion 52a. As a result, electrons are injected to the n-layer 43 from a portion in contact with the n-layer 43 of the pad portion 51, a portion in contact with the n-layer 43 of the outer peripheral wire trace portion 52a, and the dividing portion 52b. Thus, electrons diffuse in the n-layer 43 in the device plane direction, to thereby attain uniform light emission. Needless to say, the periphery of the device is a region which is inactive to light extraction. In Embodiment 1, a portion of the outer peripheral wire trace portion 52a is left on the n-layer 43 so as to maintain current diffusion, and the remaining portion is disposed on the insulation film 80, to thereby reduce reflection or absorption of light by the outer peripheral wire trace portion 52a, whereby light extraction efficiency is enhanced. Similarly, a portion of the pad portion 51 is disposed on the n-layer 43, and the remaining portion is disposed on the insulation film 80, to thereby reduce reflection or absorption of light by the pad portion 51.

In Embodiment 1, the n-electrode 50 is configured to have two pad portions 51, the outer peripheral wire trace portion 52a, and the dividing portion 52b. However, the n-electrode 50 may have at least one pad portion 51, one contact portion, and the outer peripheral wire trace portion 52a for connecting the pad portion 51 to the contact portion. The n-electrode 50 may have one or more pad portions 51, and one or more contact portions. The contact portion may also function as the pad portion 51. In this case, the n-electrode 50 may have no contact portion. In Embodiment 1, the two pad portions 51 serve as the contact portions. The contact portion is a large area of the n-electrode 50 (specifically, an area wider than that of the square having a side corresponding to the width of the outer peripheral wire trace portion 52a), and a part or the entirety thereof is disposed on the n-layer 43.

The outer peripheral wire trace portion 52a is not necessarily provided so as to completely contour the periphery of the device as realized in Embodiment 1. Alternatively, the outer peripheral wire trace portion 52a may be provided to incompletely contour the periphery of the device, so long as it is provided so as to connect the pad portion 51 to the contact portion. For example, the outer peripheral wire trace portion 52a may be provided at only one side of a square-shaped device. Also, the pad portion 51 is not necessarily directly connected with the contact portion by the mediation of the outer peripheral wire trace portion 52a. Needless to say, the connection may be established by the mediation of, for example, the dividing portion 52b, which is a part of the wire trace portion 52 other than the outer peripheral wire trace portion 52a.

The dividing portion 52b may be optional provided, or may not be provided. That is, in the case, for example, where the device has a small area, and sufficient current diffusion in the device plane direction is attained by the pad portion 51, the contact portion, and the outer peripheral wire trace portion 52a, no dividing portion 52b is required to be provided. In contrast, in the case, for example, where the device has a large area, the dividing portion 52b is preferably provided so as to enhance current diffusion in the device plane direction. When the dividing portion 52b is provided, the pattern of the dividing portion 52b is not limited to that employed in Embodiment 1, and other patterns such as lattice, X-shape, etc. may be employed.

In the Group III nitride semiconductor light-emitting device of Embodiment 1, a part of the pad portion 51 of the n-electrode 50 is disposed on the n-layer 43, and the remaining part is disposed on the insulation film 80. However, the present invention is not limited to this configuration. The entirety of the pad portion 51 may be disposed on the n-layer 43 (see FIG. 5J), or may be disposed on the insulation film 80. However, when the entirety of the pad portion 51 is disposed on the n-layer, the pad portion 51 reflects or absorbs light, whereby light extraction efficiency may be impaired in some cases.

When a part or the entirety of the pad portion 51 is disposed on the insulation film 80, the location of the pad portion 51 on the insulation film 80 may be any of the case of Embodiment 1 and the below-described nine cases shown in FIGS. 5A to 5I.

Figure 5A:
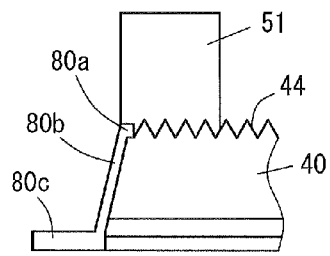
FIG. 5A to 5J are sketches each indicating the position of the pad portion 51 in Embodiment 1 and the Variations thereof.
Figure 5B:
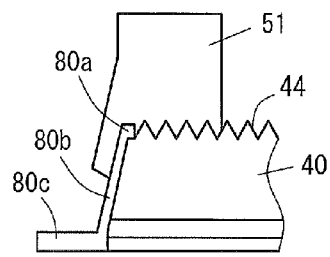
Figure 5C:
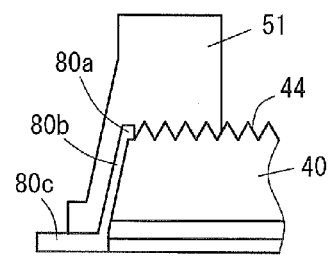

FIGS. 5A to 5C show the cases where a part of the pad portion 51 is disposed on the n-layer 43, and the remaining part is disposed on the insulation film 80. In FIG. 5A, the pad portion on the insulation film 80 is limited to only the first region 80a of the insulation film 80. In FIG. 5B, the pad portion is disposed continuously on the first and second regions 80a, 80b of the insulation film 80. In FIG. 5C, corresponding to Embodiment 1, the pad portion is disposed continuously on the first region 80a, the second region 80b, and the third region 80c of the insulation film 80. Through formation of the pad portion 51 as shown in FIGS. 5A to 5C, contact between the pad portion 51 and the n-layer 43 can be established, while reflection or absorption of light by the pad portion 51 causing impaired light extraction efficiency is reduced.

Figure 5D:
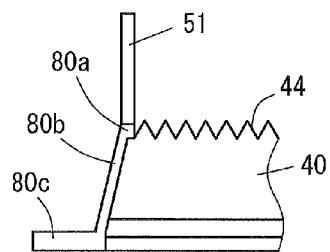
Figure 5E:
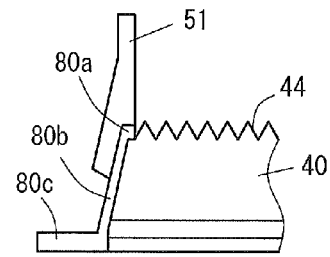
Figure 5F:
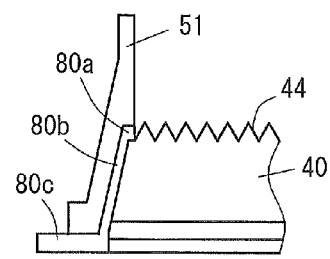
Figure 5G:
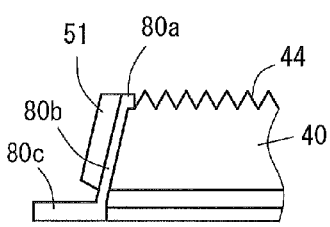
Figure 5H:
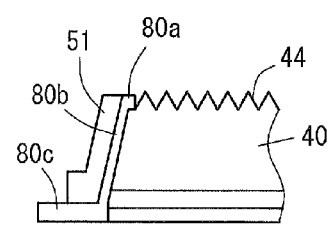
Figure 5I:
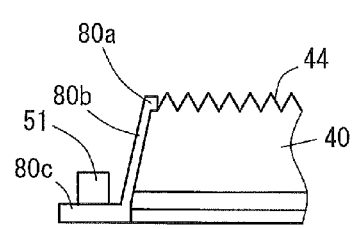
Figure 5J:
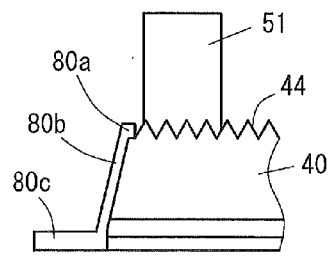

FIGS. 5D to 5I show the cases where the entirety of the pad portion 51 is disposed on the insulation film 80. In FIG. 5D, the entirety of the pad portion 51 is disposed on only the first region 80a of the insulating film 80. In FIG. 5E, the pad portion is disposed continuously on the first and second regions 80a, 80b of the insulation film 80. In FIG. 5F, the pad portion is disposed continuously on the first region 80a, the second region 80b, and the third region 80c of the insulation film 80. In FIG. 5G, the entirety of the pad portion 51 is disposed on only the second region 80b of the insulating film 80. In FIG. 5H, the pad portion is disposed continuously on the second and third regions 80b, 80c of the insulation film 80. In FIG. 5I, the entirety of the pad portion 51 is disposed on only the third region 80c of the insulating film 80. Through formation of the pad portion 51 as shown in FIGS. 5D to 5I so that the entirety of the pad portion is disposed on the insulation film 80, reflection or absorption of light by the pad portion 51 causing impaired light extraction efficiency can be reduced. Particularly in the case of FIG. 5I, since the pad portion 51 can be formed on a flat surface, steps are difficult to form in the pad portion 51, which is preferred.

Thus, the location of the pad portion 51 of the n-electrode 50 may be any of the 10 patterns shown in FIGS. 5A to 5J, and is particularly preferably any of the 9 patterns shown in FIGS. 5A to 5I. In the case where a contact portion is provided in the n-electrode 50, a part of or the entirety of the contact portion must be disposed on the n-layer 43. Therefore, the location of the contact portion must be any of the 4 patterns shown in FIGS. 5A to 5C, and 5J, and is preferably any of the 3 patterns shown in FIGS. 5A to 5C.

Figure 6A:
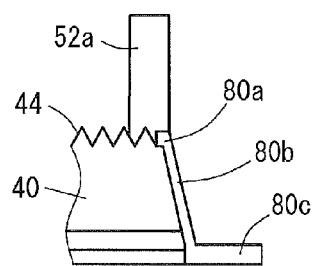
FIG. 6A to 6I are sketches each indicating the position of an outer peripheral wire trace portion 52a in Embodiment 1 and the Variations thereof.
Figure 6B:
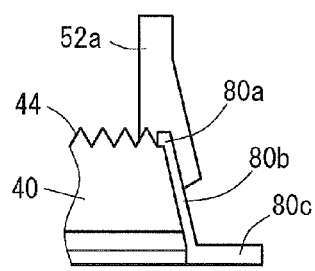
Figure 6C:
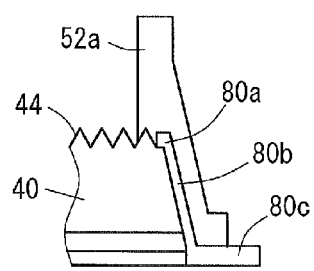
Figure 6D:
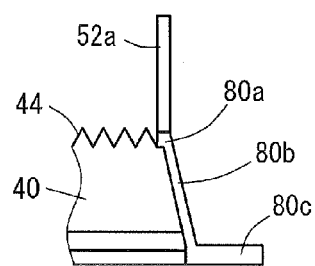
Figure 6E:
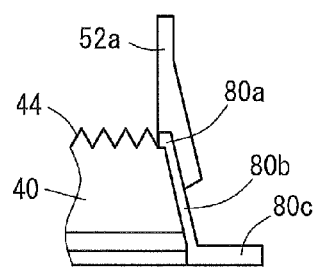
Figure 6F:
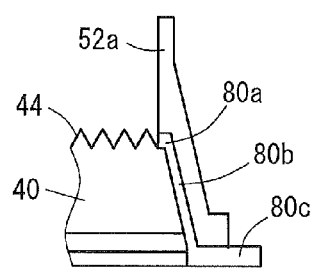
Figure 6G:
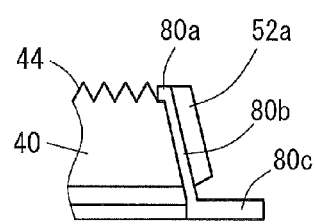
Figure 6H:
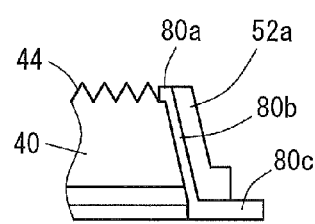
Figure 6I:
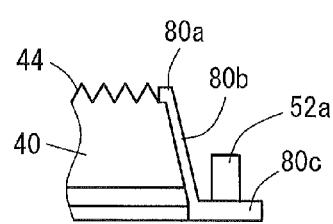

When a part or the entirety of the outer peripheral wire trace portion 52a is disposed on the insulation film 80, the location of the outer peripheral wire trace portion 52a on the insulation film 80 may be any of the below-described nine cases shown in FIGS. 6A to 6I, similar to the cases shown in FIGS. 5A to 5I. FIGS. 6A to 6I correspond to FIGS. 5A to 5I, respectively. Specifically, FIGS. 6A to 6C show the cases where a part of the outer peripheral wire trace portion 52a is disposed on the n-layer 43, and the remaining part is disposed on the insulation film 80. In FIG. 6A, the outer peripheral wire trace portion 52a on the insulation film 80 is limited to only the first region 80a of the insulation film 80 (Embodiment 1). In FIG. 6B, the outer peripheral wire trace portion 52a is disposed continuously on the first and second regions 80a, 80b of the insulation film 80. In FIG. 6C, the outer peripheral wire trace portion 52a is disposed continuously on the first region 80a, the second region 80b, and the third region 80c of the insulation film 80. FIGS. 6D to 6I show the cases where the entirety of the outer peripheral wire trace portion 52a is disposed on the insulation film 80. In FIG. 6D, the entirety of the outer peripheral wire trace portion 52a is disposed on only the first region 80a of the insulating film 80. In FIG. 6E, the entirety of the outer peripheral wire trace portion 52a is disposed continuously on the first and second regions 80a, 80b of the insulation film 80. In FIG. 6F, the entirety of the outer peripheral wire trace portion 52a is disposed continuously on the first region 80a, the second region 80b, and the third region 80c of the insulation film 80. In FIG. 6G, the entirety of the outer peripheral wire trace portion 52a is disposed on only the second region 80b of the insulating film 80. In FIG. 6H, the entirety of the outer peripheral wire trace portion 52a is disposed continuously on the second and third regions 80b, 80c of the insulation film 80. In FIG. 6I, the entirety of the outer peripheral wire trace portion 52a is disposed on only the third region 80c of the insulating film 80. In any of the cases shown in FIGS. 6A to 6I, reflection or absorption of light by the outer peripheral wire trace portion 52a can be reduced. Notably, the case shown in FIG. 5J, in which the entirety of the outer peripheral wire trace portion 52a is disposed in the n-layer 43 is not employed. If that configuration is employed, the outer peripheral wire trace portion 52a reflects or absorbs light, thereby impairing light extraction efficiency.

When two or more pad portions 51 or contact portions are provided, the pad portions 51 or the contact portions may have one single pattern selected from the 10 patterns shown in FIGS. 5A to 5J, or may have patterns different from one another selected therefrom. The outer peripheral wire trace portion 52a may have different patterns selected from those shown in FIG. 6A to 6I, at different sites. In one example, in the outer peripheral wire trace portion 52a, a part near the pad portion 51 has a pattern as shown in FIGS. 6D to 6I, in which the part is disposed on only the insulation film 80, and a part at a distance from the pad portion 51 has a pattern as shown in FIGS. 6A to 6C, in which the part is disposed on the n-layer 43 and the insulation film 80.

Variations of the pattern of the n-electrode 50 will be described with reference to the drawings. Notably, no description is made on the same members as employed in Embodiment 1.

Variation 1

Figure 7:
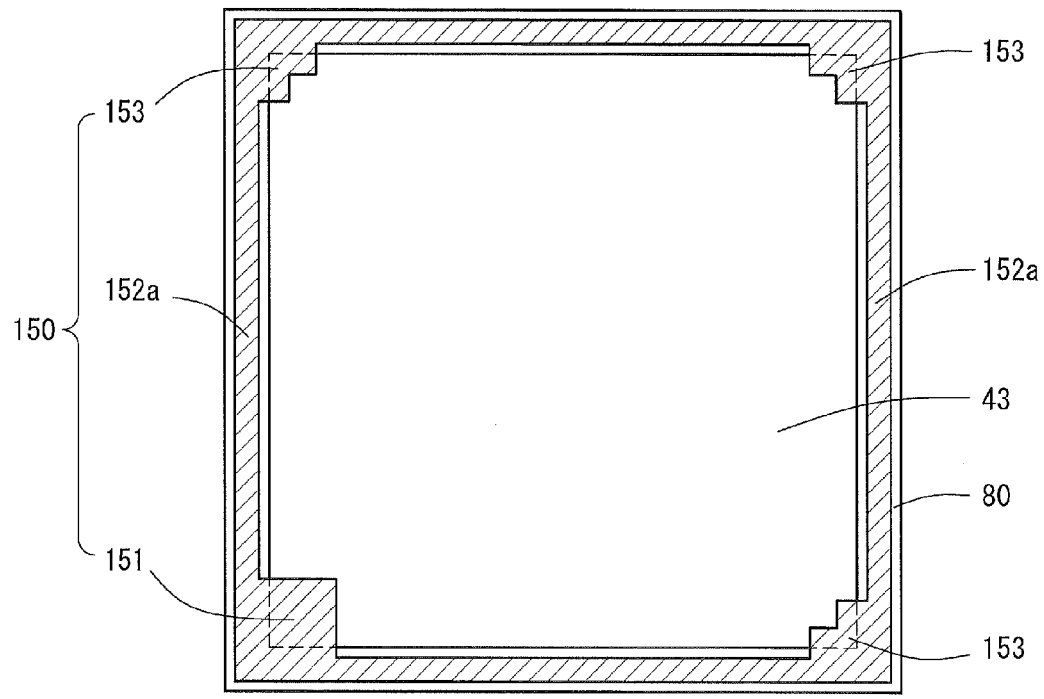
FIG. 7 is a sketch showing the configuration of an n-electrode 150 of Variation 1.

FIG. 7 is a plan view showing the configuration of the n-electrode 150 of the Group III nitride semiconductor light-emitting device of Variation 1. As shown in FIG. 7, the Group III nitride semiconductor light-emitting device of Variation 1 assumes a square in planar view. The n-electrode 150 has one pad portion 151, one outer peripheral wire trace portion 152a, and three contact portions 153.

The pad portion 151 is disposed at a corner of the square device, and three contact portions 153 are disposed at the other three corners of the square. The outer peripheral wire trace portion 152a is formed into a frame-shape completely contouring the periphery of the device and connects the pad portion 151 with the contact portions 153, and between the contact portions 153. Differing from Embodiment 1, the light-emitting device has no dividing portion. The pad portion 151 assumes a rectangular shape in planar view. Each of the contact portions 153 assumes a quasi-square-shaped in planar view having a cutout at a corner and is surrounded by the rectangular outer peripheral wire trace portion 152a. Through provision of such a cutout, the area of a portion of the contact portion 153 placed on the n-layer 43 can be reduced, whereby reflection or absorption of light by the contact portion 153 is reduced, to thereby enhance light extraction efficiency.

Regarding each of the pad portion 151 and contact portions 153, a region thereof is disposed on the n-layer 43, and the remaining region is disposed on the insulation film 80. That is, the configuration corresponds to any of the three patterns shown in FIGS. 5A to 5C. The outer peripheral wire trace portion 152a is fully disposed on the insulation film 80. That is, the configuration corresponds to any of the six patterns shown in FIGS. 6D to 6I.

Through the n-electrode 150, electrons injected from the bonding wire to the pad portion 151 are caused to diffuse in the contact portions 153 by the mediation of the outer peripheral wire trace portion 152a. Thus, electrons are injected to the n-layer 43 from a region of the pad portion 151 in contact with the n-layer 43 and a region of each of the contact portions 153 in contact with the n-layer 43, whereby electrons diffuse in the device plane direction. As a result, uniformity in light emission can be enhanced. Meanwhile, since the entire surface of the outer peripheral wire trace portion 152a is disposed on the insulation film 80 having the device isolation trench 70, reflection or absorption of light by the outer peripheral wire trace portion 152a is reduced, whereby light extraction efficiency is enhanced.

Variation 2

Figure 8:
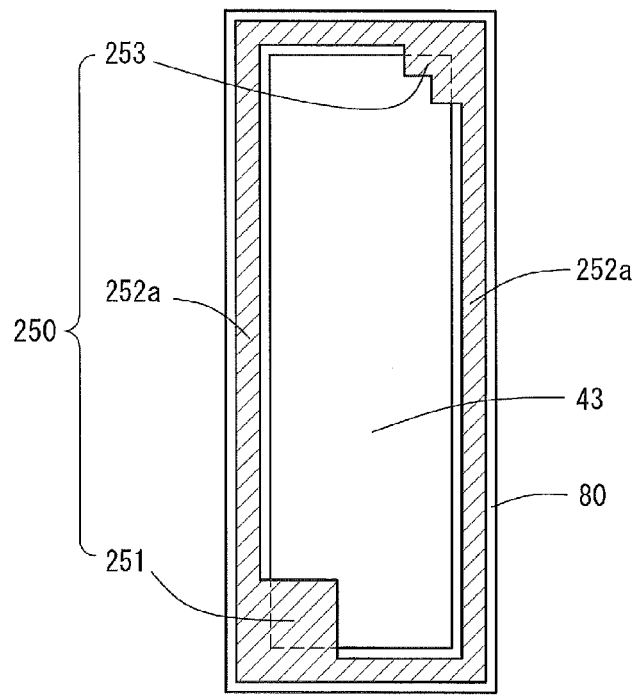
FIG. 8 is a sketch showing the configuration of an n-electrode 250 of Variation 2.

FIG. 8 is a plan view showing the configuration of the n-electrode 250 of the Group III nitride semiconductor light-emitting device of Variation 2. As shown in FIG. 8, the Group III nitride semiconductor light-emitting device of Variation 2 assumes a rectangle in planar view. The n-electrode 250 has one pad portion 251, one contact portion 253, and one outer peripheral wire trace portion 252a. The pad portion 251 is disposed at a corner of the rectangle, and the contact portion 253 is disposed at the corner of the opposite angle. The outer peripheral wire trace portion 252a is formed into a frame-shape completely contouring the periphery of the device and connects the pad portion 251 with the contact portion 253. The shape in planar view of the pad portion 251 and that of the contact portion 253 are the same as those in Variation 1. Regarding each of the pad portion 251 and contact portion 253, a region thereof is disposed on the n-layer 43, and the remaining region is disposed on the insulation film 80. The outer peripheral wire trace portion 252a is fully disposed on the insulation film 80. Thus, since the outer peripheral wire trace portion 252a is disposed on the insulation film 80 formed in the device isolation trench 70, reflection or absorption of light by the outer peripheral wire trace portion 252a is reduced, whereby light extraction efficiency is enhanced.

Variation 3

Figure 9:
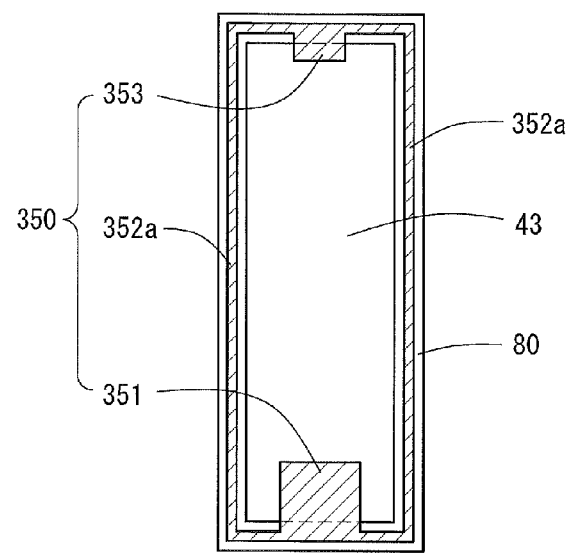
FIG. 9 is a sketch showing the configuration of an n-electrode 350 of Variation 3.

FIG. 9 is a plan view showing the configuration of the n-electrode 350 of the Group III nitride semiconductor light-emitting device of Variation 3. As shown in FIG. 9, the Group III nitride semiconductor light-emitting device of Variation 3 assumes a rectangle in planar view. The n-electrode 350 has one pad portion 351, one contact portion 353, and one outer peripheral wire trace portion 352a. The pad portion 351 is disposed in the vicinity of one shorter side of the rectangle, and the contact portion 353 is disposed in the vicinity of the other shorter side opposite the pad portion 351. The outer peripheral wire trace portion 352a is formed into a frame-shape completely contouring the periphery of the device and connects the pad portion 351 with the contact portion 353. The shape in planar view of the pad portion 351 is the same as that in Variation 1, while the contact portion 353 assumes a rectangle in planar view. Regarding each of the pad portion 351 and contact portion 353, a region thereof is disposed on the n-layer 43, and the remaining region is disposed on the insulation film 80. The outer peripheral wire trace portion 352a is fully disposed on the insulation film 80. Thus, since the outer peripheral wire trace portion 352a is disposed on the insulation film 80 formed in the device isolation trench 70, reflection or absorption of light by the outer peripheral wire trace portion 352a is reduced, whereby light extraction efficiency is enhanced.

Variation 4

Figure 10:
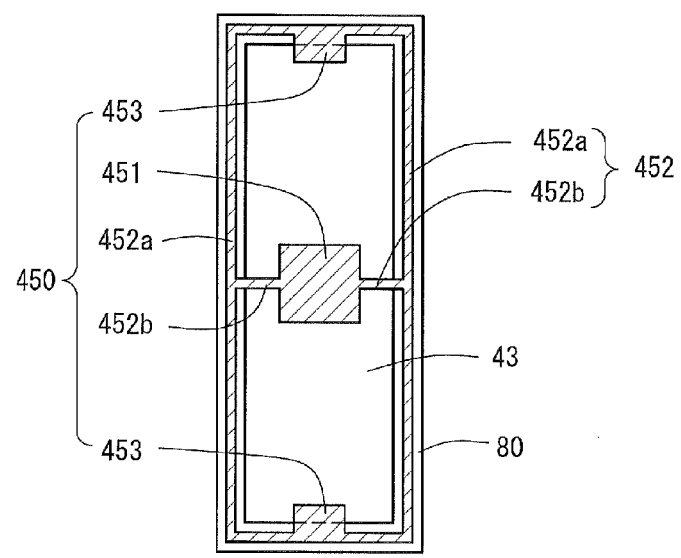
FIG. 10 is a sketch showing the configuration of an n-electrode 450 of Variation 4.

FIG. 10 is a plan view showing the configuration of the n-electrode 450 of the Group III nitride semiconductor light-emitting device of Variation 4. As shown in FIG. 10, the Group III nitride semiconductor light-emitting device of Variation 4 assumes a rectangle in planar view. The n-electrode 450 has one pad portion 451, two contact portions 453, and an wire trace portion 452. The wire trace portion 452 has an outer peripheral wire trace portion 452a and a dividing portion 452b. The pad portion 451 is disposed at the center of the rectangle, and the contact portions 453 are disposed in the vicinity of two shorter sides of the rectangle, respectively. The outer peripheral wire trace portion 452a is formed into a frame-shape completely contouring the periphery of the device and connects between the contact portions 453. The dividing portion is provided in the wire shape parallel to an imaginary line passing the center of the device and connects with the pad portion 451 at the mid portion thereof and with the outer peripheral wire trace portion 452a at each end. The shape in planar view of the pad portion 451 and that of the contact portions 453 are the same as those in Variation 3. Regarding each of the pad portion 451 and contact portions 453, a region thereof is disposed on the n-layer 43, and the remaining region is disposed on the insulation film 80. The outer peripheral wire trace portion 452a is fully disposed on the insulation film 80. Thus, since the outer peripheral wire trace portion 452a is disposed on the insulation film 80 formed in the device isolation trench 70, reflection or absorption of light by the outer peripheral wire trace portion 452a is reduced, whereby light extraction efficiency is enhanced.

The aforementioned technical concept that, in the Group III nitride semiconductor light-emitting device, of Embodiment 1, a part of the outer peripheral wire trace portion of the n-electrode is disposed on the n-layer, and the remaining part thereof is disposed on the insulation film, to thereby reduce light reflection or light absorption is, at first sight, thought to be similar to another concept that the width of the outer peripheral wire trace portion disposed on the n-layer is reduced, to thereby reduce light reflection or light absorption. However, when the width of the outer peripheral wire trace portion is decreased, the adhesion of the outer peripheral wire trace portion decreases, and satisfactory diffusion of electrons from the pad portion to a contact portion or a dividing portion fails to be attained. In contrast, in Embodiment 1, the width of the outer peripheral wire trace portion can be maintained at a conventional width, whereby the adhesion of the outer peripheral wire trace portion does not decrease, and diffusion of electrons from the pad portion to a contact portion or a dividing portion can be attained satisfactorily. In FIG. 6, the width of the outer peripheral wire trace portion seems to be varied. However, these drawings are given to clarify the locational relationship between the insulation film and the n-layer, and the outer peripheral wire trace portion, and the outer peripheral wire trace portion can be actually formed with a conventional width. Thus, the concept of the present invention completely differs in terms of action and effect, from the concept of reducing the width of the outer peripheral wire trace portion.

Variation 5

Figure 11:
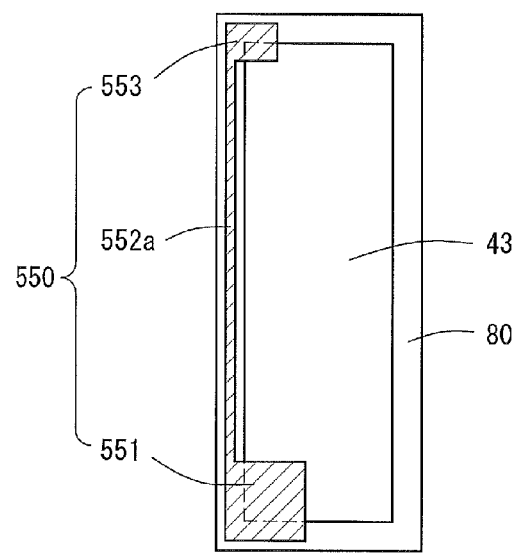
FIG. 11 is a sketch showing the configuration of an n-electrode 550 of Variation 5.

FIG. 11 is a plan view showing the configuration of the n-electrode 550 of the Group III nitride semiconductor light-emitting device of Variation 5. As shown in FIG. 11, the Group III nitride semiconductor light-emitting device of Variation 5 assumes a rectangle in planar view. The n-electrode 550 has one pad portion 551, one contact portion 553, and one outer peripheral wire trace portion 552a. The pad portion 551 is disposed at a corner at an end of a longer side of the rectangle in planar view, and the contact portion 553 is disposed at the other corner at the other end of the longer side. The outer peripheral wire trace portion 552a is formed a wire shape contouring the longer side of the rectangle and connects the pad portion 551 with the contact portion 553. The shape in planar view of the pad portion 551 and contact portion 553 is the same as that in Variation 3. Regarding each of the pad portion 551 and contact portions 553, a region thereof is disposed on the n-layer 43, and the remaining region is disposed on the insulation film 80. The outer peripheral wire trace portion 552a is fully disposed on the insulation film 80. Thus, since the outer peripheral wire trace portion 552a is disposed on the insulation film 80 formed in the device isolation trench 70, reflection or absorption of light by the outer peripheral wire trace portion 552a is reduced, whereby light extraction efficiency is enhanced.

Next, the steps of producing the Group III nitride semiconductor light-emitting device of Embodiment 1 will be described with reference to FIGS. 12A to 12I. Notably, FIGS. 12A to 12I sketches which correspond to the cross-section (cut along A-A shown in FIG. 1) of the Group III nitride semiconductor light-emitting device of Embodiment 1.

(Step of Forming Semiconductor Layer 40)

Figure 12A:
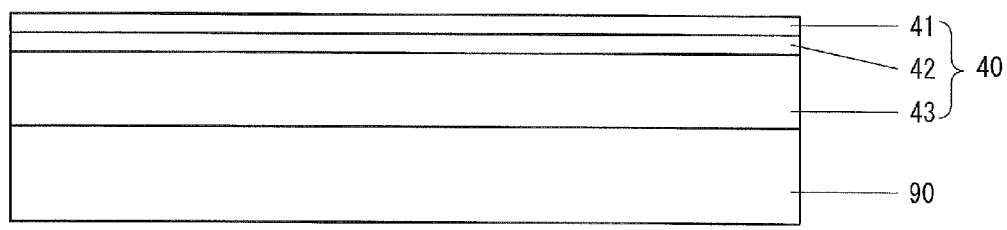
FIGS. 12A to 12I are sketches showing steps of producing the Group III nitride semiconductor light-emitting device of Embodiment 1.

Firstly, a sapphire substrate 90 is provided. The sapphire substrate 90 is subjected to thermal cleaning, to thereby remove surface impurities. An AlN buffer layer (not illustrated is formed on the sapphire substrate 90, and an p-layer 43, an active layer 42, and a p-layer 41, which are formed of a Group III nitride semiconductor, are deposited in this order on the buffer layer through MOCVD, to thereby form a semiconductor layer 40 (FIG. 12A). In MOCVD, ammonia ($NH_3$) is used as a nitrogen source gas, trimethylgallium ($Ga(CH_3)_3$) as a Ga source gas, trimethylindium ($In(CH_3)_3$) as an In source gas, trimethylaluminum ($Al(CH_3)_3$) as an Al source gas, silane ($SiH_4$) as an n-type doping gas, cyclopentadienly-magnesium ($Mg(C_5H_5)_2$) as a p-type doping gas, and $H_2$ or $N_2$ as a carrier gas. Other than the sapphire substrate 90, an SiC substrate, an ZnO substrate, a spinel substrate, or the like may also be employed.

(Step of Forming Current Injection Blocking Layer 60)

Figure 12B:
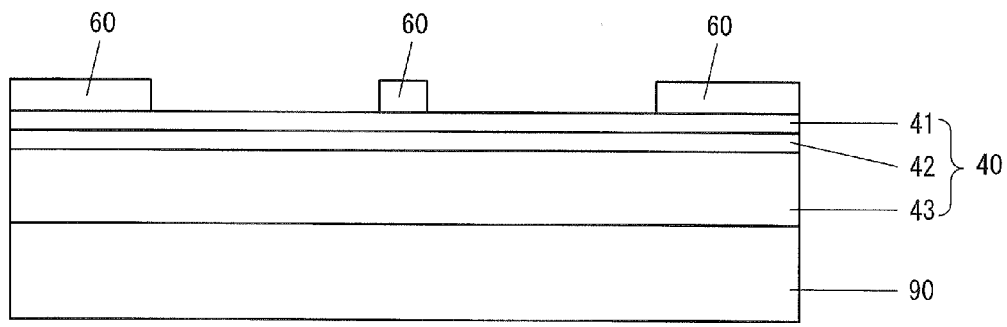

Subsequently, a current injection blocking layer 60 is formed on the p-layer 41, specifically in a region corresponding to the pattern of the n-electrode 50 in planar view and in a peripheral portion, through CVD or sputtering (FIG. 12B).

(Step of Forming P-Electrode)

Figure 12C:
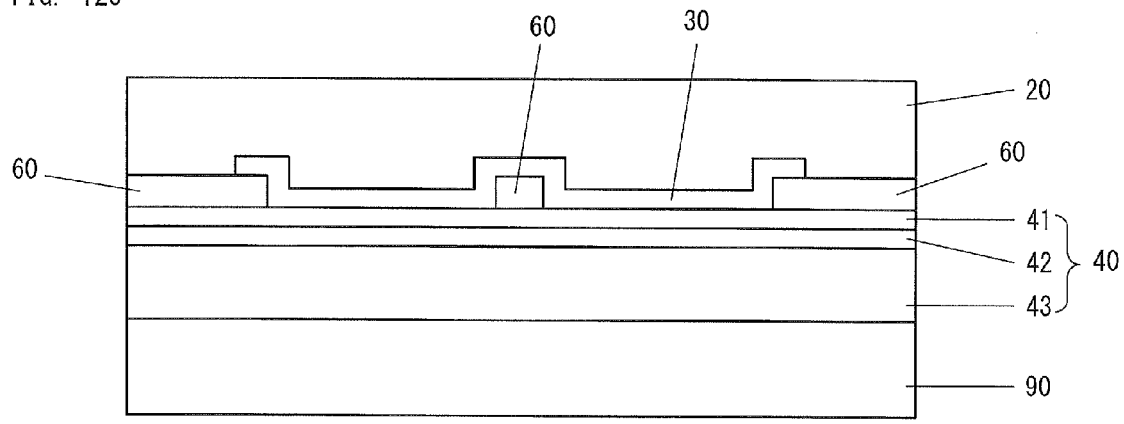

Then, a p-electrode 30 is formed, through sputtering, on the p-layer 41 and a region of the current injection blocking layer 60 other than the peripheral portion. Needless to say, other vapor deposition techniques may be employed. On the p-electrode 30, a joining layer 20 is provided (FIG. 12C). Preferably, a diffusion prevention layer is provided between the p-electrode 30 and the joining layer 20, in order to prevent diffusion of metal elements forming the joining layer 20 to the p-electrode 30 or the p-layer 41. The diffusion prevention layer may be formed of a Ti/Ni multilayer film such as a Ti/Ni/Au (the "/" refers to deposition, and "A/B" refers to film formation of A, followed by film formation of B. The same will apply hereinafter. In this case, the layers have been formed in this order from the p-electrode 30 to the joining layer), a W/Pt multilayer film such as a W/Pt/Au multilayer film, or the like.

(Step of Joining Support 10)

Figure 12D:
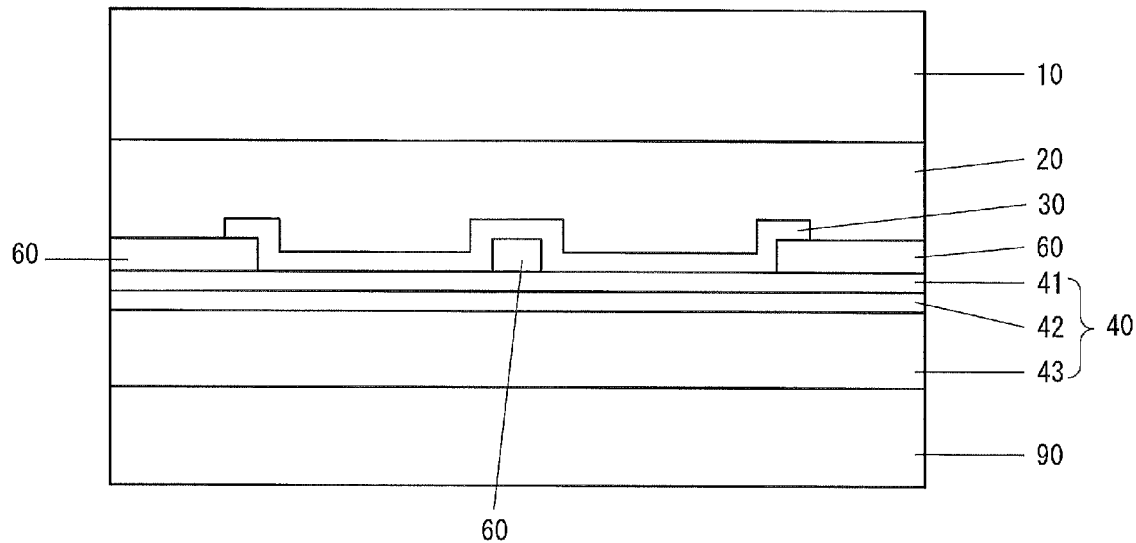

Next, a support 10 is provided. The support 10 is joined to the p-electrode 30 via the joining layer 20 (FIG. 12D). In this case, another joining layer 20 is formed on the other surface of the support 10, and the joining layer 20 on the support 10 and the joining layer 20 on the p-electrode 30 are hot pressed together, for joining.

(Laser Lift-Off Step)

Figure 12E:
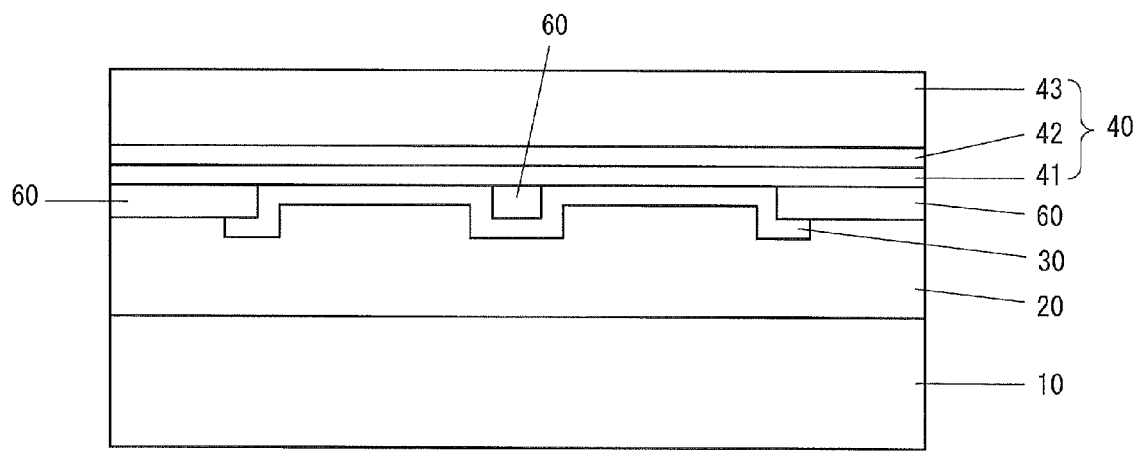

Then, the sapphire substrate 90 is removed through laser lift-off (FIG. 12E). Specifically, the sapphire substrate 90 is irradiated with a laser beam having such a wavelength that the beam penetrates sapphire and is absorbed by the Group III nitride semiconductor (e.g., an excimer laser beam (e.g., KrF)), to thereby decompose the semiconductor layer 40 present in the vicinity of the interface between the sapphire substrate 90 and the semiconductor layer 40. As a result, the sapphire substrate 90 removed out from the semiconductor layer 40.

(Step of Forming Device Isolation Trench 70)

Figure 12F:
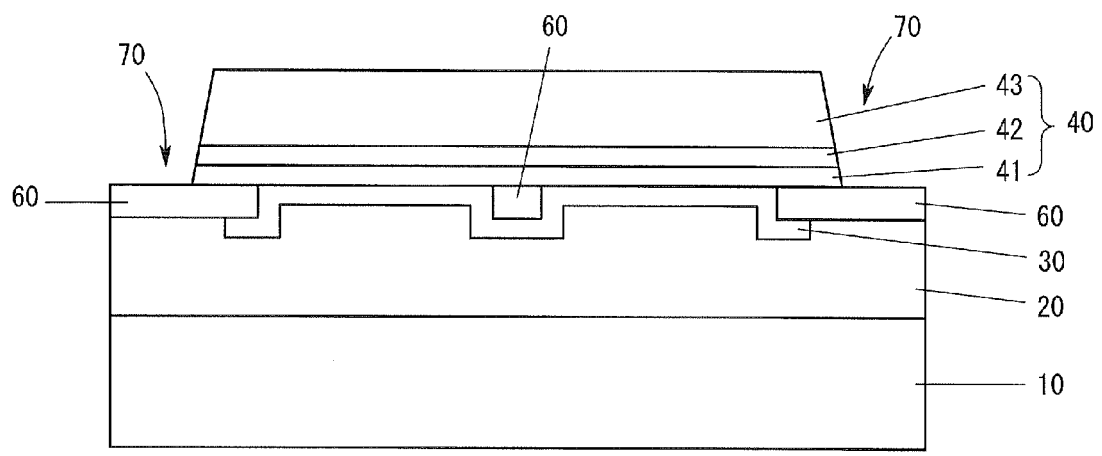

Next, the n-layer 43 is etched through dry etching (e.g., RIE (reactive ion etching)) from the top surface (opposite the light-emitting layer 42 side). The portion to be etched corresponds to a device isolation region of the n-layer 43. Through the etching, a device isolation trench 70 which penetrates the semiconductor layer 40 and reaches the current injection blocking layer 60 (FIG. 12F). Alternatively, the device isolation trench 70 may be formed through not only dry etching but also through wet etching with KOH, laser radiation or a similar etchant.

Yet alternatively, the device isolation trench 70 may be formed through the following two steps. In a first step, after formation of the semiconductor layer 40, the p-layer 41 is etched from the surface thereof (opposite the sapphire substrate 90 side) to provide a device isolation region, whereby a trench reaching the n-layer 43 is formed. Subsequently, the steps to the laser lift-off step are performed in the same manner. After completion of laser lift-off, the n-layer 43 is etched from the surface thereof to provide a device isolation region. The device isolation trench provided though etching from the surface of the p-layer 41 and the device isolation trench provided through etching from the surface of the n-layer 43 are linked together, whereby the device isolation trench 70 penetrating the semiconductor layer 40 is formed.

(Step of Forming Insulation Film 80)

Figure 12G:
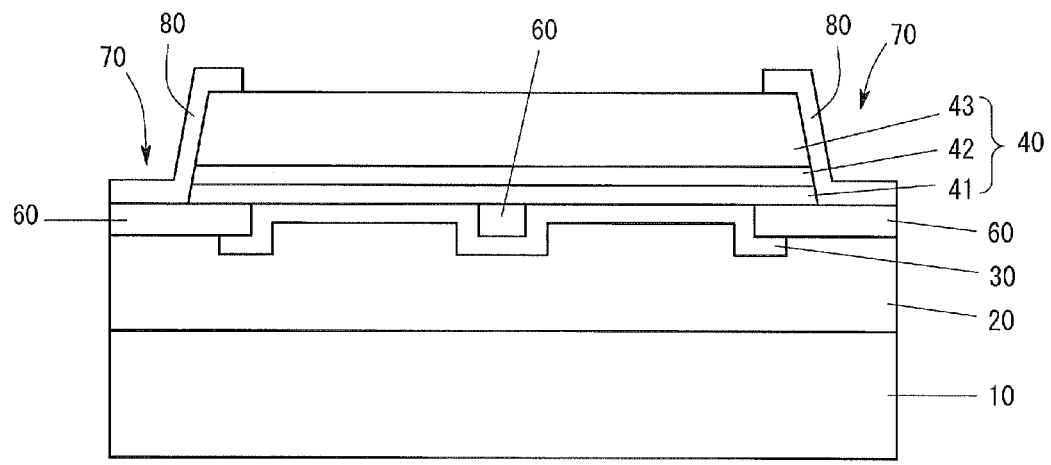

Through CVD or sputtering, an insulation film 80 continuously cover the bottom surface and the side surface of the device isolation trench 70, and the peripheral portion of the surface of the n-layer 43 is formed (FIG. 12G).

(Step of Forming Embossment 44)

Figure 12H:
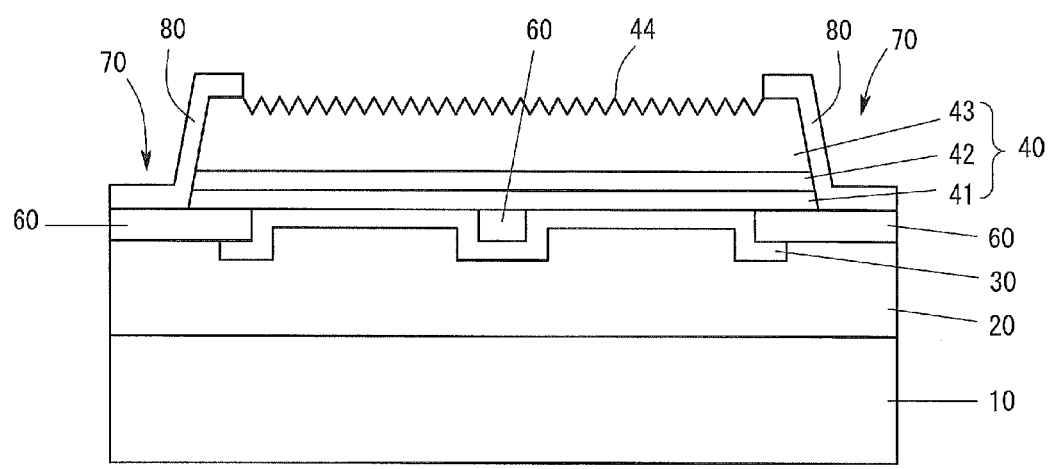

Next, the surface of the n-layer 43 is wet-etched with aqueous TMAH, to thereby provide the surface of the n-layer 43 with embossment 44 (FIG. 12H). In the wet etching, other than TMAH, etchants such as KOH, NaOH, and phosphoric acid may be employed.

No particular limitation is imposed on the chronological order of the insulation film 80 formation step and the embossment 44 formation step, after the device isolation trench 70 formation step, and the following reverse order may be employed. Firstly, embossment 44 is formed, and then the device isolation trench 70 is formed, followed by forming the insulation film 80. Still alternatively, the device isolation trench 70 is formed, and then the embossment 44 is formed, followed by forming the insulation film 80.

(Step of Forming N-Electrode 50)

Figure 12I:
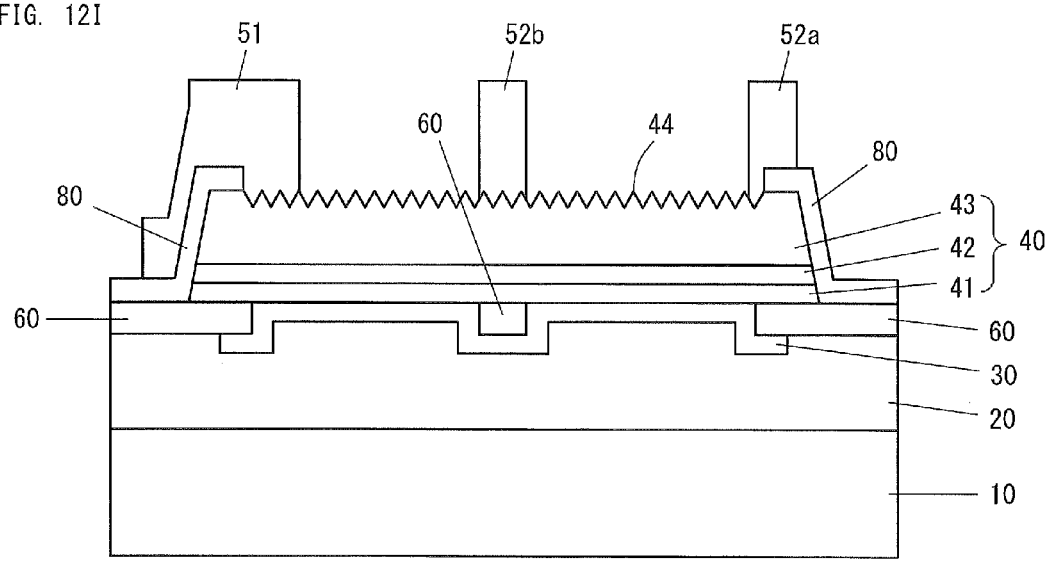

Then, the n-electrode 50 having a pattern shown in FIG. 1 is formed on a specific area of the n-layer 43 through sputtering or vapor deposition, along with lift-off (FIG. 12I). The n-electrode 50 has two pad portions 51 and a wire trace portion 52.

Subsequently, a passivation film is formed on a top surface of the device, excluding the area of the pad portion of the n-electrode 50, the area to which a bonding wire is to be bonded (not illustrated). The support 10 is polished for thinning, and a backside electrode is formed on the bottom surface of the support 10 (not illustrated). Then, device separation is performed through lase dicing. Through the aforementioned procedure, the Group III nitride semiconductor light-emitting device of Embodiment 1 may also be produced. Other than lase dicing, device separation may be performed through scribing.

Embodiment 2

Figure 13:
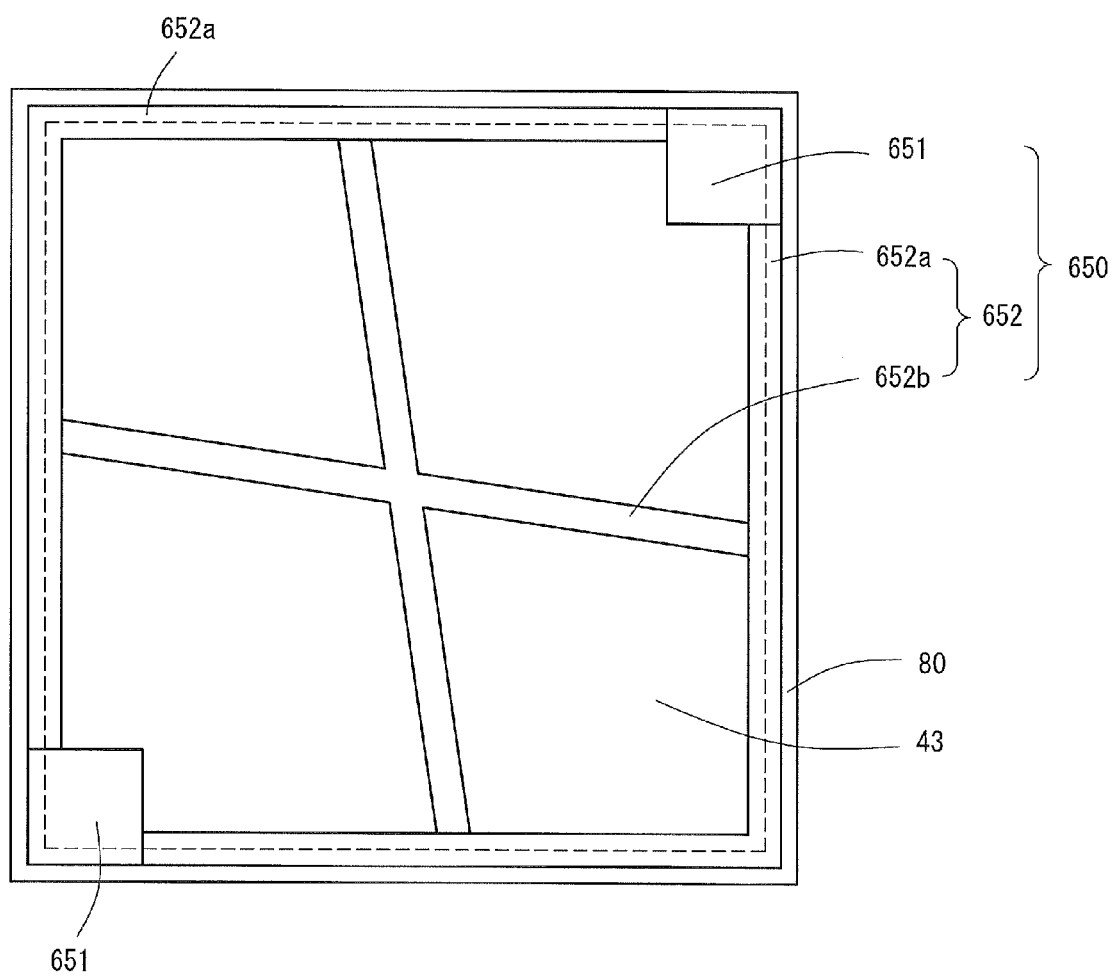
FIG. 13 is a plan view showing the configuration of the Group III nitride semiconductor light-emitting device of Embodiment 2.

FIG. 13 is a plan view showing the configuration of the Group III nitride semiconductor light-emitting device of Embodiment 2. The Group III nitride semiconductor light-emitting device of Embodiment 2 has the same structure as that of the Group III nitride semiconductor light-emitting device of Embodiment 1, except that the n-electrode 50 is changed to the below-described n-electrode 650.

Similar to the n-electrode 50 of the Group III nitride semiconductor light-emitting device of Embodiment 1, the n-electrode 650 of the Group III nitride semiconductor light-emitting device of Embodiment 2 has a pad portion 651 and a wire trace portion 652. The wire trace portion 652 has an outer peripheral wire trace portion 652a and a dividing portion 652b. The pad portion 651 and dividing portion 652b are made of a material which is different from that of the outer peripheral wire trace portion 652a. The pad portion 651 and dividing portion 652b are formed of a material which is in ohmic contact with the n-layer 43 (e.g., Ti, W, Al, Cr, and an alloy thereof). The outer peripheral wire trace portion 652a is formed of a material exhibiting higher adhesion to the insulation film 80 than to the pad portion 651. Such a material is different from that of the pad portion 651 and is Ni, Ti, Cu, Al, and an alloy thereof. Each of the pad portion 651, dividing portion 652b, outer peripheral wire trace portion 652a may be consists of a plurality of layers, so long as the layer in contact with the n-layer 43 or the insulation film 80 is formed of the aforementioned material. For example, Au may be further deposited on the entire upper surface of any of the pad portion 651, dividing portion 652b, and outer peripheral wire trace portion 652a, formed of the aforementioned material.

In the n-electrode 650, the pad portion 651 and outer peripheral wire trace portion 652a are formed from different materials, whereby the adhesion of the outer peripheral wire trace portion 652a to the insulation film 80 is improved. In this case, reliability of the device can be enhanced. Particularly when the entirety of the outer peripheral wire trace portion 652a is disposed on the insulation film 80 (corresponding to the cases of FIG. 6D to 6I), Embodiment 2 is advantageously applied, since the outer peripheral wire trace portion 652a is not required to be in ohmic contact with the n-layer 43.

In Embodiments 1 and 2, removal of the sapphire substrate, which is a growth substrate, is performed through the lift-off technique. However, alternatively, there may be employed a chemical lift-off technique, in which a buffer layer which can be dissolved by a chemical liquid chemical is interposed between the sapphire substrate and the n-layer, and the buffer layer is dissolved by the chemical liquid after joining to the support, to thereby remove out the sapphire substrate.

INDUSTRIAL APPLICABILITY

The Group III nitride semiconductor light-emitting device of the present invention may be employed as an illumination apparatus, a display device, etc.

Description of Reference Numerals

What is claimed is:

1. A Group III nitride semiconductor light-emitting device, comprising:
   a conductive support;
   a p-electrode disposed on the support;
   a semiconductor layer disposed on the p-electrode, the semiconductor layer comprising at least a p-layer, a light-emitting layer, and an n-layer disposed in this order from the p-electrode, each of the p-layer, the light-emitting layer, and the n-layer being formed of a Group III nitride semiconductor, and an n-electrode being disposed on the n-layer;
   a device isolation trench which is formed along the outer periphery of the semiconductor layer and which provides the semiconductor layer with a mesa shape; and
   an insulation film continuously provided on first to third regions, the first region being an outer peripheral region of the n-layer, the second region being the side surface of the trench, and the third region being the bottom surface of the device isolation trench,
   wherein the n-electrode comprises a pad portion to which a bonding wire is to be connected, a contact portion which is disposed at a distance from the pad portion and which is partially or fully disposed on the n-layer, and an outer peripheral wire trace portion which extends so as to contour the periphery, to thereby connect the pad portion with the contact portion, and
   wherein a part of a width of the outer peripheral wire trace portion is disposed on the insulation film, and a remaining part of the width of the outer peripheral wire trace portion is disposed on the n-layer over the total length in a longitudinal direction.

2. A Group III nitride semiconductor light-emitting device comprising:
   a conductive support;
   a p-electrode disposed on the support;
   a semiconductor layer disposed on the p-electrode, the semiconductor layer comprising at least a p-layer, a light-emitting layer, and an n-layer disposed in this order from the p-electrode, each of the p-layer, the light-emitting layer, and the n-layer being formed of a Group III nitride semiconductor, and an n-electrode being disposed on the n-layer;
   a device isolation trench which is formed along the outer periphery of the semiconductor layer and which provides the semiconductor layer with a mesa shape; and
   an insulation film continuously provided on first to third regions, the first region being an outer peripheral region of the n-layer, the second region being the side surface of the trench, and the third region being the bottom surface of the device isolation trench,
   wherein the n-electrode comprises a pad portion to which a bonding wire is to be connected, a contact portion which is disposed at a distance from the pad portion and which is partially or fully disposed on the n-layer, and an outer peripheral wire trace portion which extends so as to contour the periphery, to thereby connect the pad portion with the contact portion, and
   wherein an entirety of the outer peripheral wire trace portion is disposed on the insulation film.

3. The Group III nitride semiconductor light-emitting device according to claim 2, wherein the outer peripheral wire trace portion is disposed on only the third region of the insulation film.

4. The Group III nitride semiconductor light-emitting device according to claim 1, wherein a part of the pad portion is disposed on the insulation film, and a remaining part of the pad portion is disposed on the n-layer.

5. The Group III nitride semiconductor light-emitting device according to claim 2, wherein a part of the pad portion is disposed on the insulation film, and a remaining part of the pad portion is disposed on the n-layer.

6. The Group III nitride semiconductor light-emitting device according to claim 3, wherein a part of the pad portion is disposed on the insulation film, and a remaining part of the pad portion is disposed on the n-layer.

7. The Group III nitride semiconductor light-emitting device according to claim 1, wherein an entirety of the pad portion is disposed on the insulation film.

8. The Group III nitride semiconductor light-emitting device according to claim 2, wherein an entirety of the pad portion is disposed on the insulation film.

9. The Group III nitride semiconductor light-emitting device according to claim 3, wherein an entirety of the pad portion is disposed on the insulation film.

10. The Group III nitride semiconductor light-emitting device according to claim 7, wherein the entirety of the pad portion is disposed on the third region of the insulation film.

11. The Group III nitride semiconductor light-emitting device according to claim 8, wherein the entirety of the pad portion is disposed on the third region of the insulation film.

12. The Group III nitride semiconductor light-emitting device according to claim 9, wherein the entirety of the pad portion is disposed on the third region of the insulation film.

13. The Group III nitride semiconductor light-emitting device according to claim 1, wherein a part of the contact portion is disposed on the insulation film, and a remaining part of the contact portion is disposed on the n-layer.

14. The Group III nitride semiconductor light-emitting device according to claim 2, wherein a part of the contact portion is disposed on the insulation film, and a remaining part of the contact portion is disposed on the n-layer.

15. The Group III nitride semiconductor light-emitting device according to claim 1, wherein the n-layer has an embossed surface on the side opposite the light-emitting layer.

16. The Group III nitride semiconductor light-emitting device according to claim 1, wherein the pad portion, the contact portion and the outer peripheral wire trace portion of the n-electrode are formed of a same material.

17. The Group III nitride semiconductor light-emitting device according to claim 16, wherein the pad portion, the contact portion and the outer peripheral wire trace portion of the n-electrode comprises at least one selected from a group consisting of Ti, W, Al, Cr, and an alloy thereof.

18. A Group III nitride semiconductor light-emitting device, comprising:
   a conductive support;
   a p-electrode disposed on the support;
   a semiconductor layer disposed on the p-electrode, the semiconductor layer comprising at least a p-layer, a light-emitting layer, and an n-layer disposed in this order from the p-electrode, each of the p-layer, the light-emitting layer, and the n-layer being formed of a Group III nitride semiconductor, and an n-electrode being disposed on the n-layer;

a device isolation trench which is formed along the outer periphery of the semiconductor layer and which provides the semiconductor layer with a mesa shape; and an insulation film continuously provided on first to third regions, the first region being an outer peripheral region of the n-layer, the second region being the side surface of the trench, and the third region being the bottom surface of the device isolation trench, wherein the n-electrode comprises a pad portion to which a bonding wire is to be connected, a contact portion which is disposed at a distance from the pad portion and which is partially or fully disposed on the n-layer, and an outer peripheral wire trace portion which extends so as to contour the periphery, to thereby connect the pad portion with the contact portion and which is fully disposed on the insulation film, or which is partially disposed on the insulation film, a remaining part thereof being disposed on the n-layer, and wherein the pad portion and the contact portion serving as n-electrodes comprise a material which is in ohmic contact with the n-layer, and the outer peripheral wire trace portion serving as the n-electrode comprises a material exhibiting an adhesion to the insulation film higher than an adhesion of the material of the pad portion.

19. The Group III nitride semiconductor light-emitting device according to claim 18, wherein the pad portion and the contact portion comprise at least one selected from a group consisting of Ti, W, Al, Cr, and an alloy thereof, and the outer peripheral wire trace portion comprises a material which is different from the material of the pad portion and which comprises at least one selected from a group consisting of Ni, Ti, Cu, Al, and an alloy thereof.

20. The Group III nitride semiconductor light-emitting device according to claim 1, wherein the contact portion also serves as the pad portion.

* * * * *